(12) United States Patent
Murata et al.

(10) Patent No.: US 9,048,275 B2
(45) Date of Patent: Jun. 2, 2015

(54) TRANSPORT SYSTEM AND SET-UP METHOD

(75) Inventors: Masanao Murata, Ise (JP); Tatsuya Kumehashi, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 701 days.

(21) Appl. No.: 13/387,300

(22) PCT Filed: Jul. 23, 2010

(86) PCT No.: PCT/JP2010/004719
§ 371 (c)(1),
(2), (4) Date: Jan. 26, 2012

(87) PCT Pub. No.: WO2011/013338
PCT Pub. Date: Feb. 3, 2011

(65) Prior Publication Data
US 2012/0128452 A1    May 24, 2012

(30) Foreign Application Priority Data

Jul. 29, 2009    (JP) .............................. 2009-176385

(51) Int. Cl.
*H01L 21/677*    (2006.01)
*H01L 21/673*    (2006.01)

(52) U.S. Cl.
CPC .... *H01L 21/67775* (2013.01); *H01L 21/67733* (2013.01); *Y10S 414/14* (2013.01); *H01L 21/67379* (2013.01)

(58) Field of Classification Search
CPC .................. H01L 21/67379; H01L 21/67733; H01L 21/67775

USPC .......................... 414/940, 589, 591; 294/67.5
See application file for complete search history.

(56) References Cited

U.S. PATENT DOCUMENTS

| | | | |
|---|---|---|---|
| 5,697,749 A | 12/1997 | Iwabuchi et al. | |
| 6,092,678 A * | 7/2000 | Kawano et al. | ................. 212/86 |
| 6,679,194 B2 * | 1/2004 | Ham et al. | ..................... 118/500 |
| 6,715,978 B2 * | 4/2004 | Lin et al. | .................. 414/416.05 |

(Continued)

FOREIGN PATENT DOCUMENTS

| | | | | |
|---|---|---|---|---|
| JP | 04307954 A | * | 10/1992 | ..................... 414/940 |
| JP | 05017006 A | * | 1/1993 | ..................... 414/283 |

(Continued)

OTHER PUBLICATIONS

Official Communication issued in International Patent Application No. PCT/JP2010/004719, mailed on Oct. 26, 2010.

(Continued)

*Primary Examiner* — James Keenan
(74) *Attorney, Agent, or Firm* — Keating & Bennett, LLP

(57) ABSTRACT

In a transport system, a positioning hole is provided in an undersurface of a container. A positioning protrusion corresponding to the positioning hole of the container is provided on a first load port of a manufacturing device. When a transport vehicle places the container onto the first load port, the placement position of the container is established by having the positioning protrusion of the first load port fit into the positioning hole. A second load port different from the first load port of the manufacturing device is provided on a storage device. A positioning protrusion is not provided on the second load port. A slip prevention member is provided on an upper surface of the second load port.

11 Claims, 11 Drawing Sheets

(56) References Cited

U.S. PATENT DOCUMENTS

| | | | |
|---|---|---|---|
| 6,848,882 B2 * | 2/2005 | Chen et al. | 414/626 |
| 7,108,899 B2 * | 9/2006 | Extrand et al. | 428/34.1 |
| 7,441,999 B2 * | 10/2008 | Nakao et al. | 414/217.1 |
| 7,524,104 B2 * | 4/2009 | Malasky et al. | 366/208 |
| 7,578,240 B2 * | 8/2009 | Shiwaku | 104/89 |
| 7,686,176 B2 * | 3/2010 | Murata | 212/332 |
| 7,762,754 B2 * | 7/2010 | Maetaki | 414/281 |
| 7,810,645 B2 * | 10/2010 | Huang et al. | 206/710 |
| 7,887,278 B2 * | 2/2011 | Hoshino | 414/217.1 |
| 8,632,295 B2 * | 1/2014 | Onishi et al. | 414/785 |
| 2002/0114685 A1 | 8/2002 | Inui | |
| 2007/0163461 A1 | 7/2007 | Shiwaku | |

FOREIGN PATENT DOCUMENTS

| | | | | |
|---|---|---|---|---|
| JP | 05146984 A | * | 6/1993 | 414/940 |
| JP | 6-20326 U | | 3/1994 | |
| JP | 6-61330 A | | 3/1994 | |
| JP | 7-106409 A | | 4/1995 | |
| JP | 8-264457 A | | 10/1996 | |
| JP | 11-208830 A | | 8/1999 | |
| JP | 2002-249211 A | | 9/2002 | |
| JP | 2002-270660 A | | 9/2002 | |
| JP | 2006-49454 A | | 2/2006 | |
| JP | 2007-191235 A | | 8/2007 | |
| JP | 2009-49250 A | | 3/2009 | |
| JP | 2009-105109 A | | 5/2009 | |

OTHER PUBLICATIONS

English translation of Official Communication issued in corresponding International Application PCT/JP2010/004719, mailed on Feb. 16, 2012.

* cited by examiner

TRANSPORT SYSTEM AND SET-UP METHOD

BACKGROUND OF THE INVENTION

1. Field of the Invention

The present invention relates to a transport system including a transport device arranged to lower an article to a load port and a set-up method for the same.

2. Description of the Related Art

There is a known transport device arranged to lower a transported article to a load port onto which the article is to be loaded (e.g., see Japanese Laid-open Patent Publication No. 2002-270660 (FIG. 1)). Japanese Laid-open Patent Publication No. 2002-270660 describes a case in which a transport device lowers a transported article to a load port provided on a manufacturing apparatus. The transported article undergoes various manufacturing processes after it is loaded onto the load port of the manufacturing apparatus. In order for the article to be properly processed by the manufacturing apparatus, the article must be placed precisely at a prescribed position on the load port of the manufacturing apparatus.

Consequently, in some cases, positioning means such as positioning protrusions and positioning holes are provided on/in the transported article and the load port in order to position the transported article with respect to the load port in a horizontal direction (e.g., see Japanese Laid-open Patent Publication No. 2009-105109 (FIG. 2)).

In order for a transport device to precisely position a transported article with respect to a load port using the kind of positioning means disclosed in Japanese Laid-open Patent Publication No. 2009-105109, it is necessary to precisely set the position to which the article will be lowered by the transport device in advance. When a transported article is loaded to a load port of a manufacturing apparatus as explained above, it is imperative to accomplish this kind of precise positioning in order for the article to be properly processed by the manufacturing apparatus.

In order to improve the transport efficiency of an entire article transport process, it is common to provide temporary placement locations for temporarily storing a transported article. If it is necessary to set the position of an article at the temporary placement location as precisely as that at the manufacturing apparatus, an excessive amount of work may be required to install the entire transport system.

SUMMARY OF THE INVENTION

Preferred embodiments of the present invention provide a transport system that is easier to install, and a set-up method for the same.

A plurality of preferred embodiments of the present invention will now be explained.

Various features, elements, characteristics, steps, etc. of the preferred embodiments of the present invention can be combined freely as desired.

A transport system according to a preferred embodiment of the present invention includes a first load port and a second load port each including a loading surface arranged to allow an article including a positioning hole located in an undersurface to be loaded from above, a transport device arranged to lower an article to the first load port and the second load port, and a slip prevention member provided on a loading surface of the second load port. A positioning protrusion corresponding to the positioning hole is provided on the loading surface of the first load port. A positioning protrusion is not provided on the loading surface of the second load port. The slip prevention member includes an upper surface such that a static friction force occurring between the upper surface and the undersurface of an article is larger than a static friction force occurring between the loading surface of the second load port and the undersurface of the article. The transport device is arranged to align the positioning hole with the positioning protrusion when lowering an article to the first load port and to place the article on the slip prevention member when lowering an article to the second load port.

With this transport system, a positioning alignment is executed between the positioning protrusion and the positioning hole when lowering an article to the first load port. Meanwhile, when lowering an article to the second load port, a positioning protrusion is not provided and the article is placed on the slip prevention member. Consequently, it is very easy to set up the positioning required for the transport device to load an article to the second load port and the work required to install the entire transport system can be reduced.

It is preferable for an undersurface of an article to be tilted with respect to a horizontal direction immediately before the conveyor device loads the article onto the second load port and for the loading surface of the second load port to be tilted with respect to a horizontal direction such that an angle between the undersurface of an article and the loading surface is smaller than an angle between the undersurface of the article and a horizontal direction immediately before the article is loaded onto the second load port. There are situations in which an article cannot be placed onto the second load port in a level fashion due to the position of the center of gravity of the article or a manner in which the article is supported by the transport device. In such a situation, there is a risk that the article will be subjected to an excessive load or impact if the article is loaded onto the loading surface without accommodating for the unlevel orientation of the article. By making the loading surface tilted such that the angle between the loading surface and the undersurface of the article is reduced as explained above, the article can be placed on the loading surface in a proper manner.

If an undersurface of an article includes a first surface and a second surface that is arranged higher than the first surface, then it is preferable for the slip prevention member to have a thickness such that when the article is placed on the second port, the second surface contacts an upper surface of the slip prevention member and the first surface is separated from the loading surface of the second port. In this way, even if the undersurface of an article includes two levels arranged in a step-shaped configuration, a situation in which the article is subjected to an impact or a load due to the first surface directly contacting the loading surface can be avoided because the thickness of the slip prevention member is set such that the first surface is separated from the loading surface.

It is acceptable for the transport device preferably to include a gripping section arranged to grip an article and a moving section arranged to move the gripping section in a vertical direction while supporting the gripping section in a suspended state. When a format in which an article is lowered in a suspended state is adopted, it is often difficult to position the article with respect to a horizontal direction. Therefore, it is effective to combine a transport system according to the aforementioned preferred embodiment of the present invention, which enables a positioning set-up to be accomplished easily, with the gripper section and the moving section described above.

An article tends to become tilted when it is lowered in a suspended state due to such factors as the position of the center of gravity of the article. Therefore, the features described above are particularly effective when combined with the feature of sloping the loading surface such that an angle between the loading surface and an undersurface of the article is smaller.

It is acceptable for the moving section to include a moving arm arranged to move the gripping section in a horizontal direction while holding the gripping section in a suspended state. There is a possibility that the moving arm will flex downward when it moves horizontally while suspending the gripping section. Consequently, positioning the article in a horizontal direction tends to be difficult and the article tends to become tilted. Therefore, it is effective to combine the feature of having a movement arm with a transport system according to the aforementioned preferred embodiment of the present invention (which enables a positioning set-up to be accomplished easily) and particularly effective to combine the feature of a movement arm with the feature of sloping the loading surface such that an angle between the loading surface and an undersurface of the article is smaller.

It is acceptable for the system to further include a processing device arranged to execute a manufacturing process with respect to an article and a storage device arranged to store an article and for the first load port to be a port provided on the processing device and the second load port to be a port provided on the storage device. A positioning pin is provided on the first load port because an article must be positioned precisely at the processing device, where a manufacturing process will be executed with respect to the article. Meanwhile, a positioning pin preferably is not provided at the second load port because the such precise positioning is not required at the storage device, where the article will be merely stored. Thus, by using a load port that is not provided with a positioning pin in locations that do not require precise positioning, the work required for setting up the positioning and, thus, the work required for installing the entire system can be greatly reduced.

A transport system according to another preferred embodiment of the present invention includes a processing device arranged to execute a manufacturing process on an article including a positioning hole located in a undersurface, a storage device arranged to store an article, a first load port that is provided on the processing device and includes a loading surface arranged to allow an article including a positioning hole located in an undersurface to be loaded from above, a second load port that is provided on the storage device and has a loading surface arranged to allow an article including a positioning hole located in an undersurface to be loaded from above, a track provided above the first load port, a transport vehicle arranged to move along the track while suspending an article and to lower an article to the first load port and the second load port in a suspended state, and a slip prevention member provided on a loading surface of the second load port. A positioning protrusion corresponding to the positioning hole is provided on the loading surface of the first load port. A positioning protrusion is not provided on the loading surface of the second load port. The slip prevention member includes an upper surface such that a static friction force occurring between the upper surface and the undersurface of an article is larger than a static friction force occurring between the loading surface of the second load port and the undersurface of the article. The transport vehicle is arranged to align the positioning hole with the positioning protrusion in a horizontal direction when lowering an article to the first load port and to place the article on the slip prevention member when lowering an article to the second load port.

When the transport vehicle is arranged to transport an article in a suspended state and lower the article to the processing device, then it is necessary to position the article precisely with respect to the load port provided on the processing device. Therefore, a positioning pin is provided on the first load port of the processing device. Meanwhile, since precise positioning is not required with respect to the storage device, a positioning pin is preferably not provided on the second load port. Thus, by using a load port that is not provided with a positioning pin in locations that do not require precise positioning, the work required for setting up the positioning and, thus, the work required for installing the entire system can be greatly reduced.

A transport system set-up method according to another preferred embodiment of the present invention is a set-up method for a transport system provided with a plurality of first load ports and a plurality of second load ports. The transport system set-up method preferably includes the following steps: lowering an article to each of the first load ports while adjusting a position in a horizontal direction; lowering the article to one of the second load ports while adjusting a position in a horizontal direction; and acquiring information to control a position of the article with respect to each of the second load ports based on a result of lowering the article to the one second load port.

Thus, although it is necessary to acquire control information related to the first load ports by lowering an article to each of the first load ports, information related to the second load ports is acquired by lowering an article to only one second load port. As a result, the positioning set-up for lowering articles is easier to accomplish.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
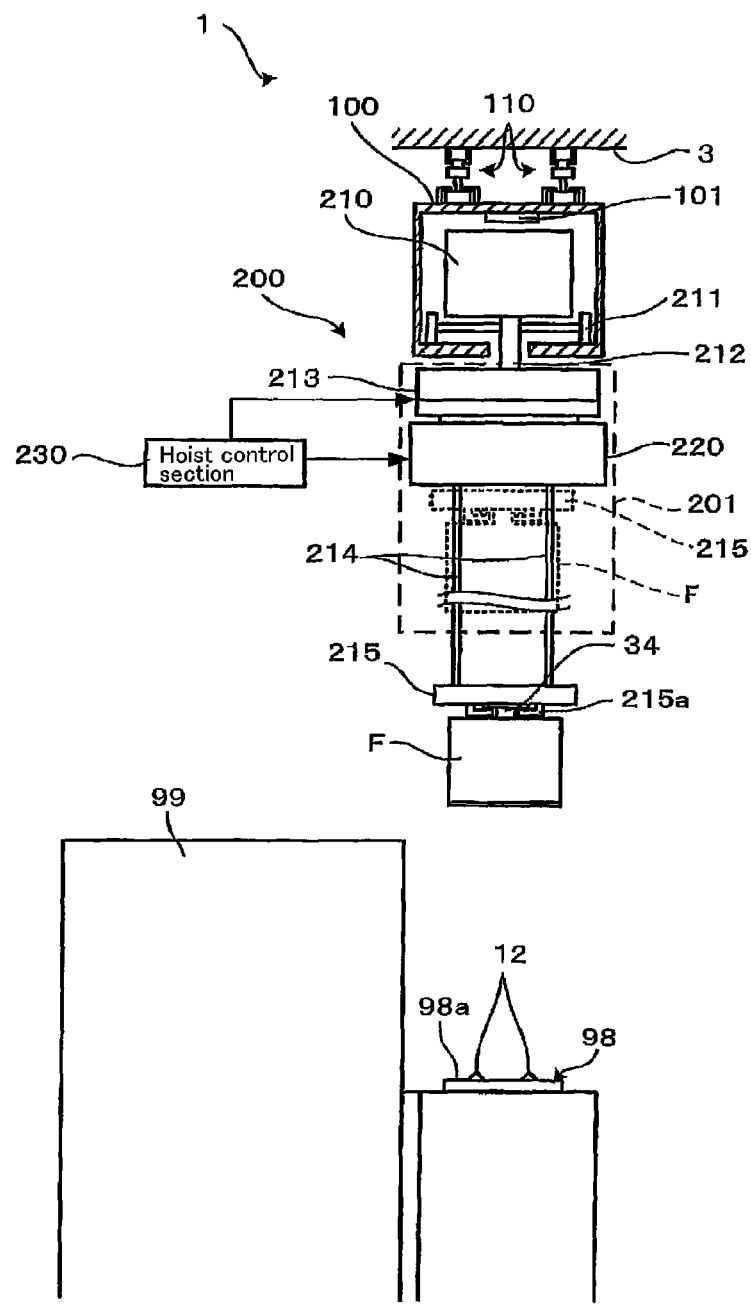
FIG. 1 is a cross sectional view of a track included in a transport system according to a first preferred embodiment of the present invention and a frontal view of a transport vehicle arranged to move along the track.

A transport system 1 according to a first preferred embodiment of the present invention will now be explained. FIG. 1 is a sectional view of a track 100 included in a transport system 1 and a frontal view of a transport vehicle 200 (during transport) arranged to move along the track 100.

Figure 2:
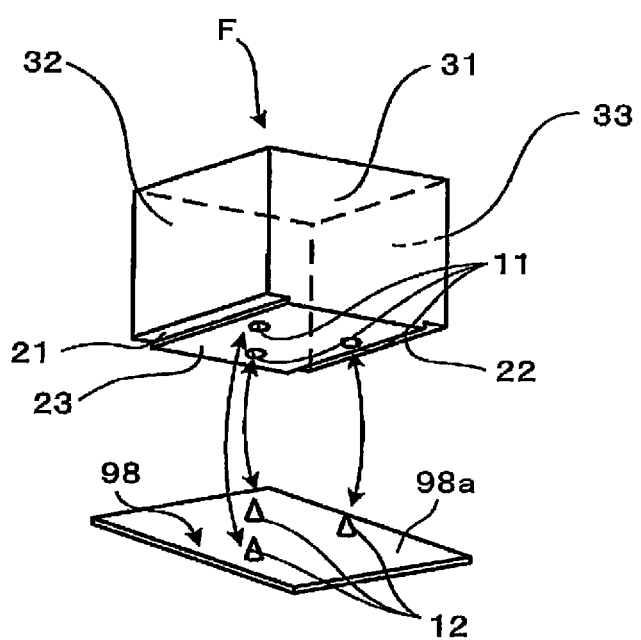
FIG. 2 is a perspective view of a load port and a container transported by a transport vehicle.

The transport system 1 may be installed in a semiconductor substrate manufacturing plant and convey a container F inside the plant. The container F may be a hollow member that is substantially cubical in shape and includes a step-shaped level difference on an undersurface as shown in FIG. 2, for example. More specifically, step-shaped portions are arranged on each of left and right sides of the container F when viewed from a front surface 31 of the container F. Thus, the undersurface preferably includes a third undersurface 23 located between the two step-shaped portions, a first undersurface 21 located between one of the step-shaped portions and a side surface 32, and a second undersurface 22 located between the other one of the step-shaped portions and a side surface 33. The first to third undersurfaces 21 to 23 preferably are flat and parallel to each other, or substantially flat and substantially parallel to each other. The third undersurface 23 is arranged lower than the first undersurface 21 and the second undersurface 22, and constitutes a protruding section A (FIG. 3B) explained later. The first undersurface 21 and the second undersurface 22 are arranged at the same position in a vertical direction. For example, the height difference of the step-shaped portions preferably is about 2 mm to about 3 mm, for example, and, in a plan view, the respective widths (smaller dimension in a plan view) of the first undersurface 21 and the second undersurface 22 are both approximately 15 mm, for example.

A plurality of semiconductor substrates that will be subjected to various treatments in a manufacturing process are stored inside the container F. A door that can be opened and closed freely is provided in the front surface 31 of the container F. The door is opened to allow semiconductor substrates to be removed from the inside of the container F and to allow semiconductor substrates to be stored into the container F.

Figure 3A:
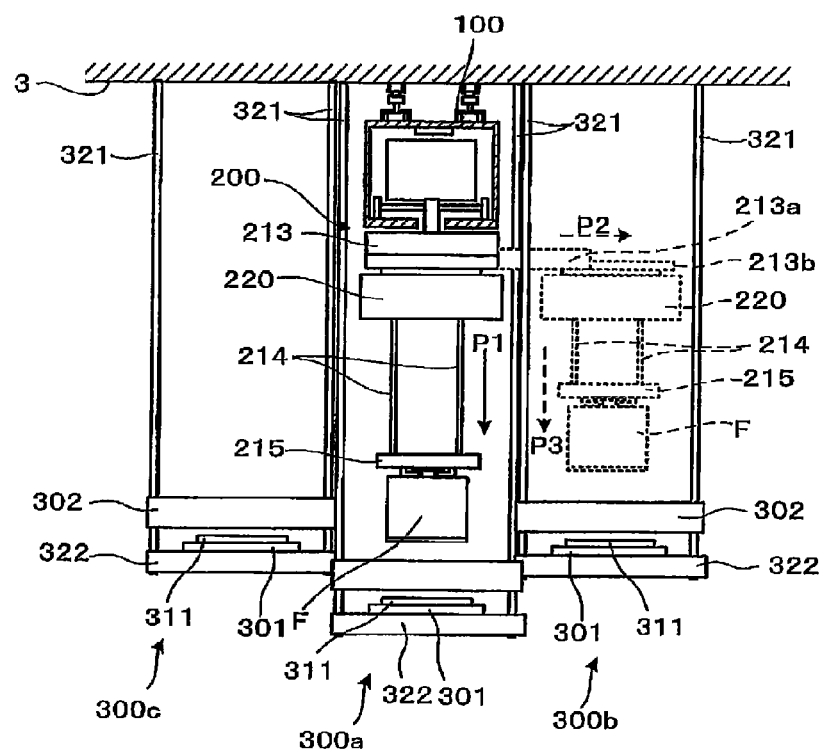
FIG. 3A is sectional view of a track together with a frontal view of a storage device and a transport vehicle.
Figure 3B:
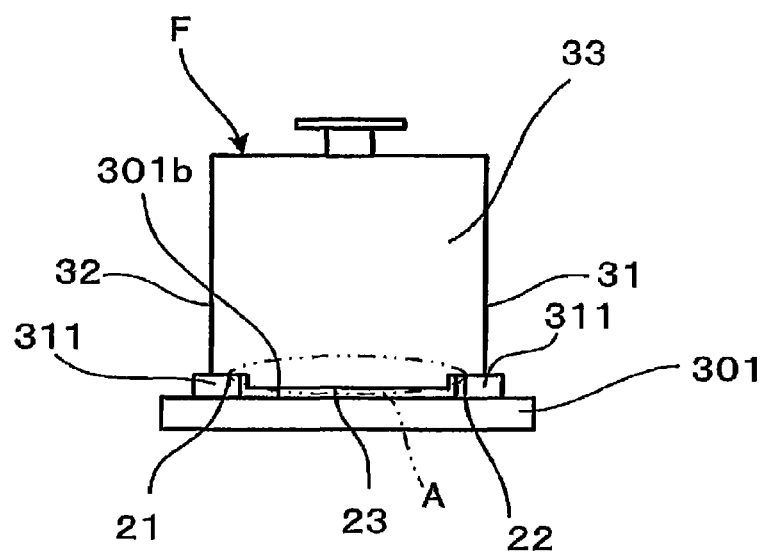
FIG. 3B is a frontal view of a container placed on a load port located on a right side of the storage device.

Various processing devices, including various manufacturing devices, and a storage device to store containers F are arranged inside the plant. The processing devices are arranged to apply various processing treatments to the semiconductor substrates inside the container F. FIG. 2, FIG. 3A, and FIG. 3B show a storage device 300 and a manufacturing device 99, providing examples of the storage device and such a processing device. The manufacturing device 99 preferably includes a first load port 98 including an upper surface 98a for a container F to be loaded onto. The first load port 98 preferably is a flat plate-shaped member that includes the flat upper surface 98a and is fixed to the manufacturing device 99 such that the upper surface 98a is level.

The track 100 is fastened to a ceiling 3 of the plant with fastening members 110 such that the track 100 is arranged near the ceiling 3 and follows along a prescribed conveyance path that passes through a vicinity above the first load port 98. FIG. 1 shows a sectional view of the track 100 lying in a plane perpendicular to the prescribed conveyance path.

That is, the track 100 extends along a direction perpendicular to the plane of the paper in FIG. 1. A hollow space exists inside the track 100, and a movement mechanism 210 for a transport vehicle 200 (explained later) is housed inside this hollow space.

The transport vehicle 200 (transport device) includes a movement mechanism 210. The traveling mechanism 210 is a mechanism enabling the transport vehicle 200 to travel along the track 100 using, for example, a linear motor. When a linear motor is adopted, the traveling mechanism 210 moves the transport vehicle 200 along the track 100 using an alternating magnetic action of a secondary permanent magnet 101 provided inside the track 100. Traveling wheels 211 are provided under the traveling mechanism 210. The traveling wheels 211 contact a bottom surface inside the track 100 such that the transport vehicle 200 is supported on that bottom surface. It is also acceptable to use a movement mode other than a linear motor mode. For example, it is acceptable for the traveling mechanism 210 to be arranged to move along the track 100 by driving the traveling wheels 211 with a drive motor.

A main body casing 201 is attached to the traveling mechanism 210 in a suspended fashion through a frame 212. In order to view other parts more easily, the main body casing 201 is depicted with a broken line in FIG. 1 and omitted in FIG. 2 and subsequent drawings. A hoist mechanism 220 and a horizontal position adjusting mechanism 213 from which the hoist mechanism 220 is suspended are provided inside the main body casing 201. The horizontal position adjusting mechanism 213 is a mechanism to adjust a horizontal position of the hoist mechanism 220. The horizontal position adjusting mechanism 213 includes arms 213a and 213b and a drive member to drive the arms 213a and 213b. The arms 213a and 213b can move transversely left and right in a sliding fashion from the position shown in FIG. 1. The drive member may move them leftward or rightward and return them to the position shown in FIG. 1. The broken line in FIG. 3A depicts an example in which the arm 213a and the arm 213b have been moved rightward from the position shown in FIG. 1. The movement of the arms 213a and 213b moves the hoist mechanism 220 in a transverse direction. It is also acceptable to arrange the arms 213a and 213b such that they can move to only the right side or only the left side from the position shown in FIG. 1. A mechanism to adjust a position of the hoist mechanism 220 in a rotational direction within a horizontal plane is also preferably provided in the horizontal position adjusting mechanism 213.

The hoist mechanism 220 preferably includes four suspension belts 214. Only two of the four suspension belts 214 are shown in FIG. 1. The hoist mechanism 220 is arranged to suspend a gripping mechanism 215 with the four suspension belts 214. The gripping mechanism 215 includes an arm 215a. The arm 215a can grip a top flange 34 of a container F from the left and right and release its grip on the top flange 34. Thus, for example, the gripping mechanism 215 can be configured to release a container F after the container F has been placed onto the first load port 98 and to grip a container F that has been placed on the first load port 98. So long as a mechanism that supports the container F is provided, it is acceptable if that mechanism is not arranged to grip the container F in the manner of the gripping mechanism 215.

The hoist mechanism 220 includes a drive member arranged to reel in and reel out the four suspension belts 214. The gripping mechanism 215 rises when the drive member reels in the suspension belts 214, and the gripping mechanism 215 descends when the drive mechanism reels out the suspension belts 214. In this way, the gripping mechanism 215 and a gripped container F are raised and lowered between the position indicated with a dotted line in FIG. 1 and the position indicated with a solid line.

In this preferred embodiment, the horizontal position adjusting mechanism 213 and the hoist mechanism 220 correspond to a "moving member" according to a preferred embodiment of the present invention. A hoist control section 230 controls the operation of the horizontal position adjusting mechanism 213 and the hoist mechanism 220. The hoist control section 230 includes hardware components such as memory devices and processor circuitry installed inside the main body housing 201 and software programmed to cause the hardware components to execute a control process to control the operations of the horizontal position adjusting mechanism 213 and the hoist mechanism 220.

The manufacturing device 99 may open a lid of the container F, extract a semiconductor substrate from the inside of the container F, and perform various manufacturing processes with respect to the semiconductor substrate. In order for the manufacturing device 99 to properly extract a semiconductor substrate from the container F and perform a manufacturing treatment, it is necessary for the container F to be precisely placed at a prescribed position on the first load port 98. In order to position the container F precisely with respect to the load port 98, as shown in FIG. 2, three positioning holes 11 are preferably located in the third undersurface 23 of the container F and three positioning protrusions 12 corresponding to the three positioning holes 11 are preferably located on the upper surface 98a of the first load port 98, for example. A placement position of the container F in a horizontal direction is established by placing the container F on the first load port 98 such that the positioning protrusions 12 fit into the positioning holes 11.

In order for the container F to be properly placed onto the first load port 98 such that the positioning protrusions 12 fit into the positioning holes 11, it is necessary for the hoist control section 230 to properly control the operations of the horizontal position adjusting mechanism 213 and the hoist mechanism 220. That is, in addition to controlling the hoist mechanism 220 such that it lowers the gripping mechanism 215, it is necessary to control the horizontal position adjusting mechanism 213 such that the horizontal position of the container F is finely adjusted in an appropriate fashion. Consequently, when the transport system 1 is installed, it is necessary to execute a teaching process in which the horizontal position adjusting mechanism 213 is guided such that a container F is placed properly at a prescribed position on the first load port 98, and the appropriate movement distance and direction are acquired based on the guiding step, and the acquired information is stored in the hoist control section 230.

The process of adjusting the horizontal position of the container F with the horizontal position adjusting mechanism 213 is executed for each of the first load ports 98. The reason the adjustment must be executed for each load port 98 is that there are many types of manufacturing devices 99 and other processing devices and various degrees of installation precision are required. In one example, the number of first load ports 98 installed on the processing devices is five hundred to several thousand. After the teaching information has been set with respect to one transport vehicle 200, it is acceptable to execute teaching of a different transport vehicle 200 based on a result of teaching executed at a first load port 98 serving as a standard. In such a case, it is necessary to execute teaching for a number of times that is at least as large as the number of transport vehicles 200. It is also acceptable to execute teaching of each transport vehicle 200 at all of the first load ports 98.

As explained previously, in addition to manufacturing devices, the transport system 1 is provided with storage devices to temporarily store containers F. The storage devices are provided to improve an efficiency of the conveyance process, and as many as several thousand storage devices are installed in one example.

Figure 4:
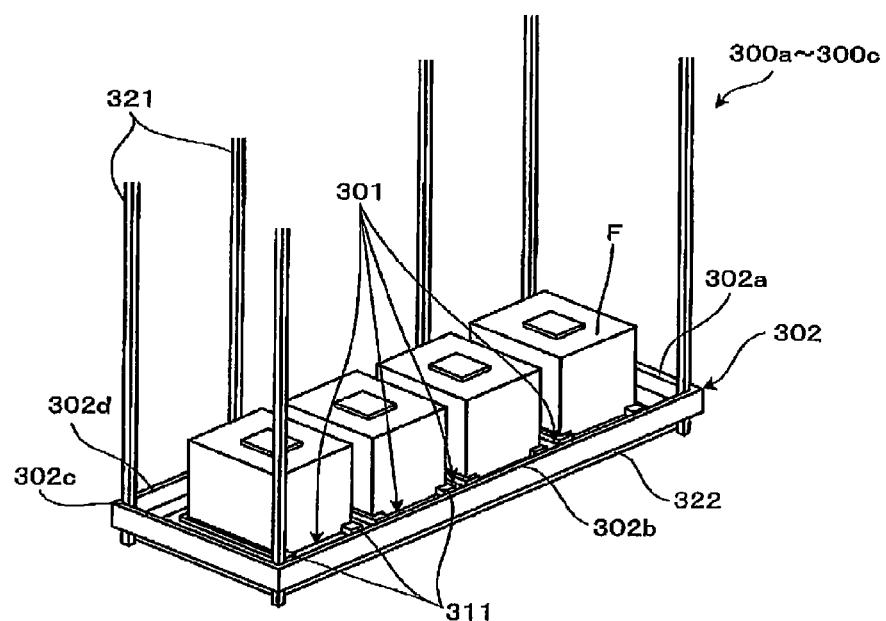
FIG. 4 perspective view of a storage device with four containers stored.

FIG. 3A and FIG. 4 show storage devices 300a to 300c exemplifying the kind of storage device mentioned here. At least one of the storage devices 300a to 300c is provided in the transport system 1. Each of the storage devices 300a to 300c has substantially the same constituent configuration and includes a bottom plate 322 and support columns 321. Each of the support columns 321 extends in a vertical direction and is fixed to the ceiling 3 at an upper end. The lower ends of the support columns 321 are fixed to the bottom plate 322 in a level fashion. The bottom plate 322 is a flat plate-shaped member having a rectangular planar shape, for example. It is acceptable for the support columns 321 to be supported on the track 100.

Four second load ports 301, for example, are arranged on an upper surface of the bottom plate 322 in a level fashion. Each of the second load ports 301 is arranged directly below the track 100 and configured to allow one container F to be placed thereon from above. That is, the storage device 300 can store a total of four containers F, for example. A drop prevention member 302 to prevent containers F loaded onto the second load ports 301 from falling off the bottom plate 322 is fixed to the support columns 321 near the bottom ends of the support columns 321. The drop prevention member 302 preferably includes four flat plate-shaped members 302a, 302b, 302c, and 302d oriented vertically. The plate-shaped members 302a to 302d are arranged along four sides of the bottom plate 322 in a plan view such that they surround the perimeter of containers F loaded onto the second load ports 301.

The storage device 300a is arranged such that the second load ports 301 are positioned directly below the track 100 in a region where the first load port 98 is not positioned. When a container F is to be loaded onto the storage device 300a, the transport vehicle 200 finely adjusts its horizontal position and lowers the gripping mechanism 215 as indicated by an arrow P1 in FIG. 3A, which is holding the container F substantially directly below the track 100. The storage devices 300b and 300c are arranged to the left and right of the track 100 from the perspective of FIG. 3A and arranged such that the second load ports 301 thereof are slightly higher than the second load ports of the storage device 300a. Each of the storage devices 300b and 300c is installed in a region where the manufacturing device 99 or another processing device is not installed below or a region where, even though a processing device is installed below, there is plenty of space in a region near the ceiling because a height of the device is not very large.

When a container F is to be loaded to the storage device 300b or 300c, the horizontal position adjusting mechanism 213 of the transport vehicle 200 moves the gripping mechanism 215 horizontally as indicated with an arrow P2 in FIG. 3A and the transport vehicle 200 lowers the gripping mechanism 215 and the container F as indicated by the arrow P3. If the transport vehicle 200 is arranged such that the horizontal position adjusting mechanism 213 can only move the hoist mechanism 220 to one side, then it is possible to only install one of the storage devices 300b and 300c.

The second load port 301 will now be explained in more detail based on FIG. 3B, FIG. 4, and FIG. 5A. The second load port 301 preferably has a rectangular shape in a plan view and an upper surface 301b thereof is flat. Two flat plate-shaped slip prevention members 311 are fixed to the upper surface 301b of the second load port 301. Each of the slip prevention members 311 has a rectangular shape in a plan view and extends along a side of the second load port 301. One of the slip prevention members 311 is arranged near an edge portion of the second load port 301, and the other slip prevention member 311 is arranged near an edge portion on an opposite side. The two slip prevention members 311 are separated by a distance such that the protruding section A (see FIG. 3B) protruding downward between the first undersurface 21 and the second undersurface 22 of the container F fits between the slip prevention members 311.

As shown in FIG. 3B, the first undersurface 21 and the second undersurface 22 of the container F touch against the upper surfaces of the slip prevention members 311 and rest on the slip prevention members 311 such that the protruding section A fits between the two slip prevention members 311. The thickness of the slip prevention members 311 in a vertical direction is adjusted such that the third undersurface 23 of the container F is separated from the upper surface 301b of the second load port 301. Thus, the thickness of the slip prevention members 311 is larger than a distance by which the first undersurface 21 and the third undersurface 23 (and by which the second undersurface 22 and the third undersurface 23) are separated in a vertical direction. As a result, the surface 23 does not contact the upper surface 301b of the second load port 301 directly and an impact or load resulted from such a contact can be prevented from acting on the container F.

In the preferred embodiment above, the distance by which the surface 21 and the surface 23 are separated in a vertical direction, i.e., the height difference of the step-shaped portion, preferably is about 2 to about 3 mm, for example. Therefore, the thickness of the slip prevention members 311 is preferably set to be larger than about 3 mm, for example. The two slip prevention members 311 are separated by a sufficient space such that the protruding section A will not get caught in the slip prevention members 311 and will be arranged between the slip prevention members 311 even if the position of the container F is offset to some degree in a horizontal direction. It is also acceptable for the slip prevention members 311 to be arranged such that portions of the surface 23 near two opposite edge portions of the surface 23 rest on the slip prevention members 311. In such a case, it is not necessary to restrict the thickness of the slip prevention members 311.

The slip prevention members 311 are made of such a material that a static friction force occurring between the undersurface of the container F and the slip prevention members 311 is larger than a static friction force occurring between the undersurface of the container F and the upper surface 301b of the second load port 301. For example, the slip prevention members 311 might be made of rubber or a resin material having a high coefficient of friction. If the transport system 1 will be used inside a clean room, it is preferable to use a urethane rubber, a silicone rubber, or a fluorine rubber, which has an excellent anti-wear characteristic and a low degree of outgassing.

Figure 5A:
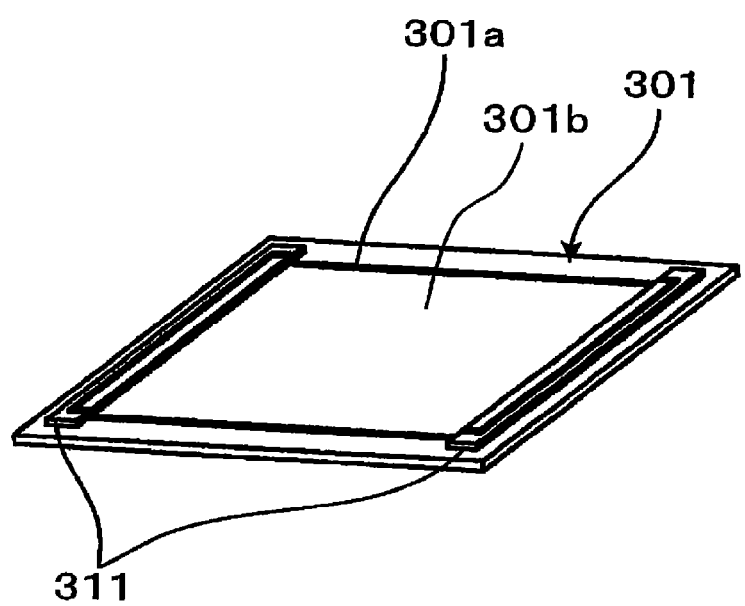
FIG. 5A is a perspective view of a load port.

As shown in FIG. 5A, a marker 301a indicating the placement position of the container F is provided on the upper surface 300b of the second load port 301. The marker 301a preferably is a line that has a rectangular shape in a plan view and is arranged along a position where an outline of the container F should be located in a plan view when the container F is placed in an appropriate position on the second load port 301 as shown in FIG. 3B. The marker 301a is used in the teaching process explained later.

As explained previously, the second load port 301 does not have protrusions like the positioning protrusions 12 of the first load port 98. The two slip prevention members 311 are separated by a sufficient space as explained previously. Thus, when a container F is loaded onto the second load port 301, the container F can be placed appropriately in a prescribed location without being positioned precisely in a horizontal direction in the manner similar to loading to the first load port 98. Since the container F is placed on the slip prevention members 311, the position of the container F does not easily shift in a horizontal direction after it has been loaded. Since the drop prevention member 302 is provided, the container F can be prevented from falling off the storage device 300 in the unlikely event the position of the container F shifts out of place.

Figure 5B:
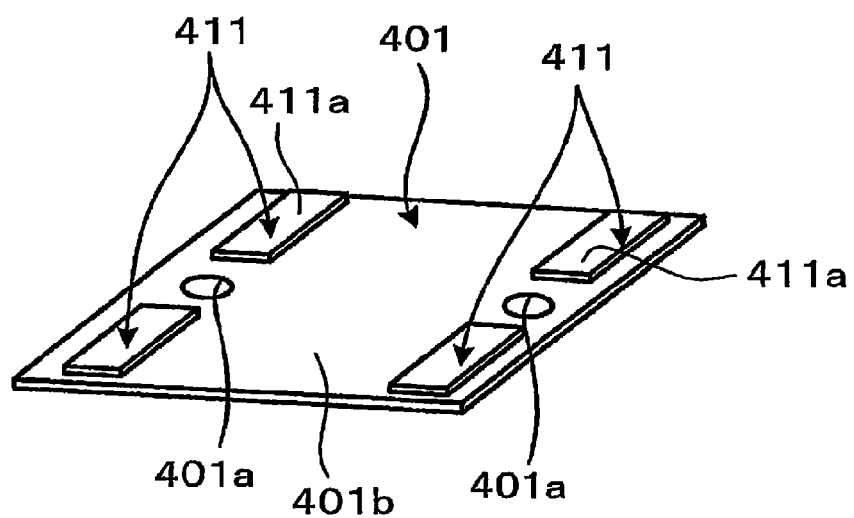
FIG. 5B is a perspective view of a load port.

FIG. 5B is a perspective view of a load port 401 that can be used instead of the second load port 301. The load port 401 has a flat upper surface 401b on which four slip prevention members 411 are installed. Two of the slip prevention members 411 are arranged near one edge of the load port 401 so as to be substantially parallel to the edge, and the other two slip prevention members 411 are arranged near the opposite edge so as to be substantially parallel to that edge. When a container F is loaded onto the load port 401, the protruding section A of the undersurface of the container F fits in-between the two slip prevention members 411 on one side and the other two slip prevention members 411 on the opposite side. The first undersurface 21 and the second undersurface 22 rest on upper surfaces 411a of the slip prevention members 411, and the third undersurface 23 is separated from the upper surface 401b of the load port 401.

A through hole 401a is provided between the two slip prevention members 411 on each side. The through holes 401a are holes for checking, from underneath, the placement position of a container F loaded onto the load port 401. For example, a mark, a hole, or other indicators located in a prescribed position on the undersurface of the container F can be viewed via the through holes 401a to determine if the container F is properly positioned.

Distinctive features of the preferred embodiment explained heretofore will now be explained.

The transport system 1 preferably includes a first load port 98 including an upper surface 98a arranged to allow a container F having positioning holes 11 located in an undersurface to be loaded thereto from above, a second load port 301 including an upper surface 301b arranged to allow a container F to be loaded thereto from above, a transport vehicle 200 arranged to lower a container F to the first load port 98 and the second load port 301, and slip prevention members 311 provided on the upper surface 301b of the second load port 301. Positioning protrusions 12 corresponding to the positioning holes 11 are provided on the upper surface 98a of the first load port 98, and positioning protrusions are not provided on the upper surface 301b of the second load port 301. The slip prevention members 311 include upper surfaces 311a such that a static friction force occurring between the undersurface of a container F and the upper surfaces 311a is larger than a static friction force occurring between the undersurface of the container F and the upper surface 301b of the second load port 301. The transport vehicle 200 is arranged to align the positioning holes 11 with the positioning protrusions 12 when lowering the container F to the first load port 98 and to place the container F on the slip prevention members 311 when lowering a container F to the second load port 301.

With this transport system 1, positioning is executed between the positioning protrusions 12 and the positioning holes 11 of the container F when lowering the container F to the first load port 98. Meanwhile, positioning protrusions are not provided on the second load port 301, and the container F is placed on the slip prevention members 311 when being lowered to the second load port 301. Consequently, the positioning required for the transport vehicle 200 to load a container F to the second load port 301 can be set easily, and the work required to install the entire transport system 1 can be facilitated.

The undersurface of the container F includes a third undersurface 23 and first and second undersurfaces 21 and 22 that are arranged higher than the third undersurface 23. The slip prevention members 311 are arranged such that the first undersurface 21 and the second undersurface 22 contact the upper surfaces 311a of the slip prevention members 311 and the third undersurface 23 is separated from the upper surface 301b of the second load port 301.

In this way, even though the undersurface of the container F includes two levels in a step-shaped configuration, a situation in which the container F is subjected to an impact or load due to the third surface 23 directly contacting the upper surface 301b is avoided because the thickness of the slip prevention member 311 is set such that the third surface 23 is separated from the upper surface 301b.

Second Preferred Embodiment

Figure 6A:
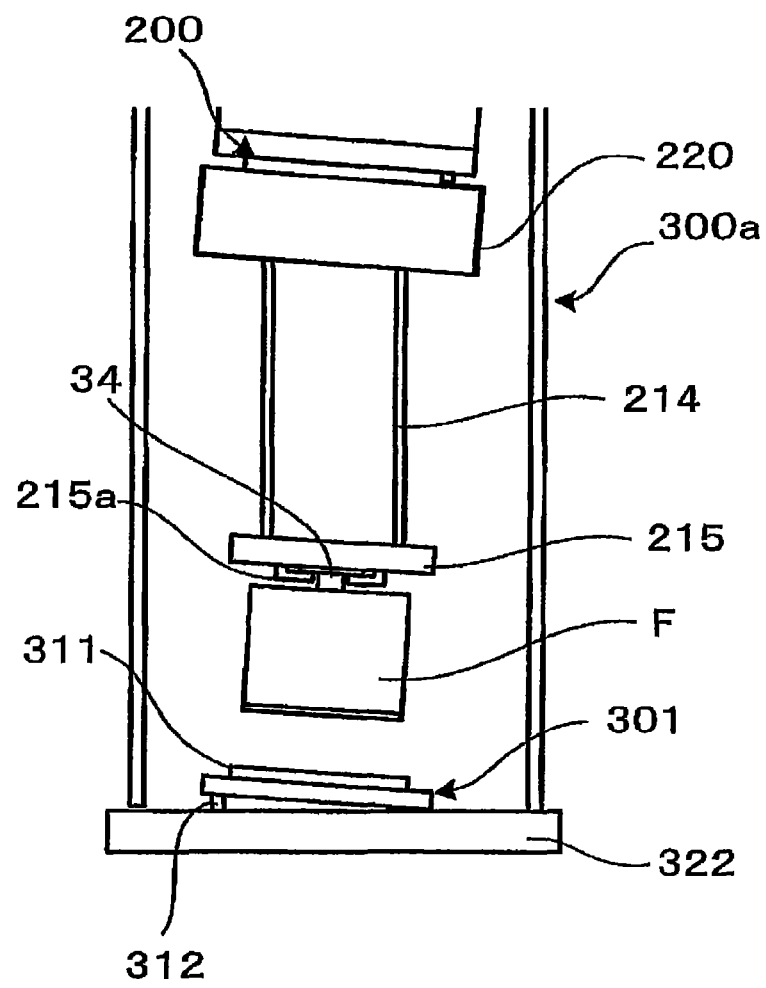
FIG. 6A is a frontal view of a storage device and a transport vehicle according to a second preferred embodiment of the present invention.
Figure 6B:
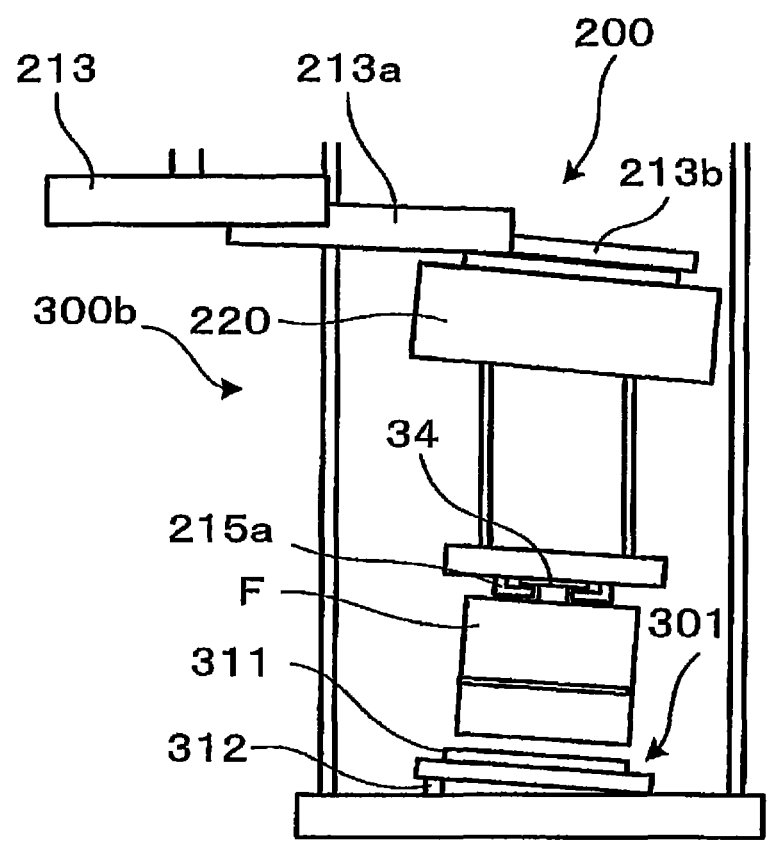
FIG. 6B is a frontal view of a storage device and a transport vehicle according to the second preferred embodiment of the present invention.

A second preferred embodiment will now be explained. Many of the constituent elements and configurations of the second preferred embodiment preferably are the same or substantially the same as those of the first preferred embodiment. However, unlike the first preferred embodiment, the second preferred embodiment anticipates a situation in which the undersurface of a container F is tilted with respect to a horizontal plane when the container F is suspended by the transport vehicle 200, as shown in FIGS. 6A and 6B. Examples of situations in which a container F is suspended in a tilted fashion are explained in (a) to (c) below.

(a) The center of gravity of the container F is offset in a horizontal direction with respect to a position where the gripping mechanism 215 grips.

(b) When the arms 213a and 213b of the horizontal position adjusting mechanism 213 slide in a horizontal direction, the arms flex downward (FIG. 6B) such that the hoist mechanism 220 is tilted and, thus, the gripping mechanism 215 suspended from the hoist mechanism 220 is tilted.

(c) There are situations in which the container F itself undergoes deformation such that the undersurface becomes tilted.

FIG. 6B illustrates an example in which the undersurface of the container F is tilted at an angle of about 0.5 degree to about 0.7 degree, for example, with respect to a horizontal plane. In this specification, an angle between two planes is assumed to be equivalent to an acute angle between normal lines of the respective planes.

If the second load port 301 is arranged to be level, as in the first preferred embodiment, and an arm 215a of the gripping mechanism 215 is tilted, then when the gripping mechanism 215 is used to grip a container F, the arm 215a could hit the top flange 34 of the container F and cause an impact against or a large vibration in the container F. Also, when a container F is moved away from the second load port 301 or placed onto the second load port 301, the container F will shift between a tilted state and a level state. Consequently, there is a possibility that the undersurface of the container F will be dragged against the slip prevention members 311 and cause the slip prevention members 311 to wear and release particulates, thereby reducing a service life of the system.

Therefore, in the second preferred embodiment, the second load port 301 is tilted in accordance with the tilted state of the container F. More specifically, as shown in FIGS. 6A and 6B, the second load port 301 is fixed to the storage device 300 in such a tilted state that the upper surface 301b of the second load port 301 is parallel to the undersurface of the container F. For example, a fastening tool 312 serving to fasten the second load port 301 to a bottom plate 322 is used to separate one side of the second load port 301 from the bottom plate 322 so as to tilt the entire second load port 301.

By tilting the second load port 301 as explained above, the arm 215a is prevented from hitting against the top flange 34 when the gripping mechanism 215 grips a container F and a container F is prevented from being dragged against the slip prevention members 311 when the container F is placed on the second load port 301. Furthermore, the previously explained problems can be solved so long as the tilt of second load port 301 is adjusted such that an angle between the upper surface 301b of the second load port 301 and the undersurface of the container F is smaller than an angle that would have existed between the upper surface 301b of the second load port 301 and the undersurface of the container F if the upper surface 301b of the second load port 301 were level.

Figure 7:
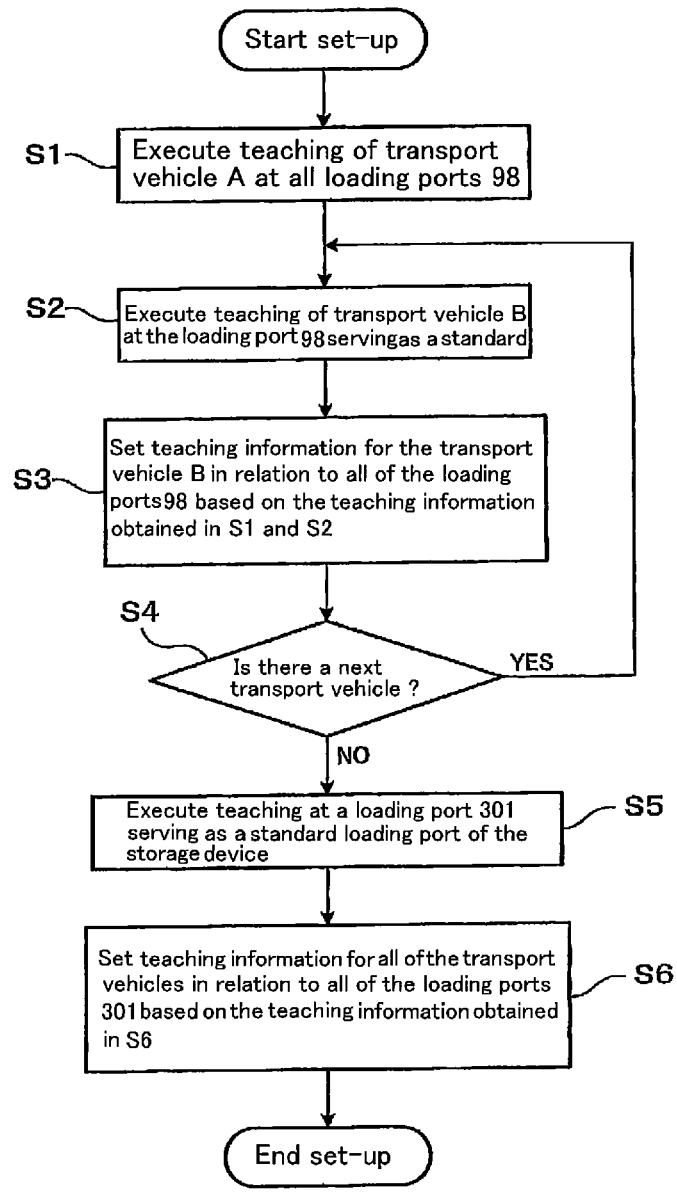
FIG. 7 is a flowchart related to a set-up method for ensuring that the transport vehicle loads a container appropriately to a load port.

A set-up method for setting up a system according to the first or second preferred embodiment such that the transport vehicle 200 will place containers F properly onto the first load ports 98 and the second load ports 301 will now be explained. FIG. 7 is a flowchart showing a sequence of steps of the set-up method. In the case of the second preferred embodiment, the tilt of the second load port 301 preferably is set in advance when the entire transport system is designed, by determining how much the bottom surface of a container F suspended by the transport vehicle 200 will be tilted from a horizontal direction. Since the tilt direction and tilt angle of a container F are substantially determined when the shape and size of the container F are known, it is generally sufficient to set the tilt of the second load port 301 based on one container F. However, it is also acceptable to vary factors such as the number of objects housed in the container F, how the objects are arranged in the container F, location where the second load port 301 will be installed, and a positional relationship between the second load port 301 and the track 100, to acquire the tilt of the container F under each of the variations, and set the tilt of the second load port 301 in view of the tilt angles obtained under the different variations.

Figure 8A:
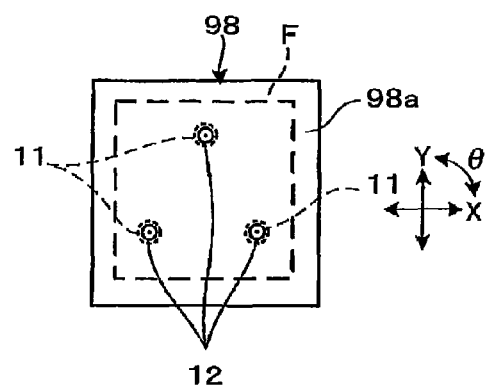
FIG. 8A is a plan view showing a positional relationship between a container and a load port provided on a manufacturing device.

As shown in FIG. 7, first, a teaching process (step S1) is executed in which one transport vehicle 200 that serves as a standard (hereinafter called "transport vehicle A") is driven such that it lowers a container F to a first load port 98. The teaching process is a process whereby the transport vehicle 200 is taught a position where a container F is to be lowered, the teaching being chiefly related to a horizontal direction. More specifically, as shown in FIG. 8A, the horizontal position adjusting mechanism 213 is guided such that the container F will be placed at a position on the first load port 98 where the positioning protrusions 12 will fit into the positioning holes 11 of the container F. As a result, information for allowing the transport vehicle 200 to place a container F properly onto the first load port 98 at a prescribed position is stored in a control device (not shown). The information includes information related to an X direction, a Y direction, and a e direction used by the horizontal position adjusting mechanism 213 to finely adjust in a horizontal direction. This teaching process is executed at each of the first load ports 98 by driving the transport vehicle A. That is, the teaching process is repeated for a number of times that is equal to the number of first load ports 98 provided in the transport system 1. In this way, teaching information for the transport vehicle A is acquired in relation to all of the first load ports 98.

Next, a transport vehicle 200 (hereinafter called "transport vehicle B") that has not yet completed the teaching process is taught at a first load port 98 that serves as a standard or at a first load port 98 provided specifically for teaching (step S2). A difference between teaching information acquired with the transport vehicle A and teaching information acquired with the transport vehicle B is acquired in relation to the one first load port 98 that serves as the reference. This difference is the difference that occurs between the teaching information of the transport vehicle A and the teaching information of the transport vehicle B in the X, Y, and θ directions at any one of the first load ports 98. Thus, this difference results from differences between the individual transport vehicles 200.

Therefore, the teaching information acquired in step S1 for the transport vehicle A in relation to each of the first load ports 98 is revised in accordance with the differences between the individual transport vehicles 200 acquired in steps S1 and S2, and the revised teaching information is set as the teaching information for the transport vehicle B in relation to each of the first load ports 98 (step S3). For example, if the teaching information for the transport vehicle A in relation to the first load ports 98 is $X_A$, $Y_A$, and $\theta_A$ and the individual difference information is $\Delta X_B$, $\Delta Y_B$, and $\Delta \theta_B$, then the teaching information $X_B$, $Y_B$, and $\theta_B$ for the transport vehicle B in relation to each of the first load ports 98 is set to satisfy the relationships shown below. In the equations, the values $\Delta X_B$, $\Delta Y_B$, and $\Delta \theta_B$, are amounts by which the respective teaching information for the transport vehicle B differ from the teaching information for the transport vehicle A.

$$X_B = X_A + \Delta X_B, Y_B = Y_A + \Delta Y_B, \theta_B = \theta_A + \Delta \theta_B$$

After the process explained above has been executed with respect to one transport vehicle B, a determination is made as to whether a transport vehicle 200 that has not undergone teaching still exists (S4). If it is determined that a transport vehicle 200 that has not undergone teaching still exists (Yes in step S4), steps S2 and S3 are repeated with respect to that transport vehicle 200, which becomes a next transport vehicle B. If it is determined that there are no more transport vehicles 200 that have not undergone teaching (No in step S4), the sequence proceeds to step S5.

Figure 8B:
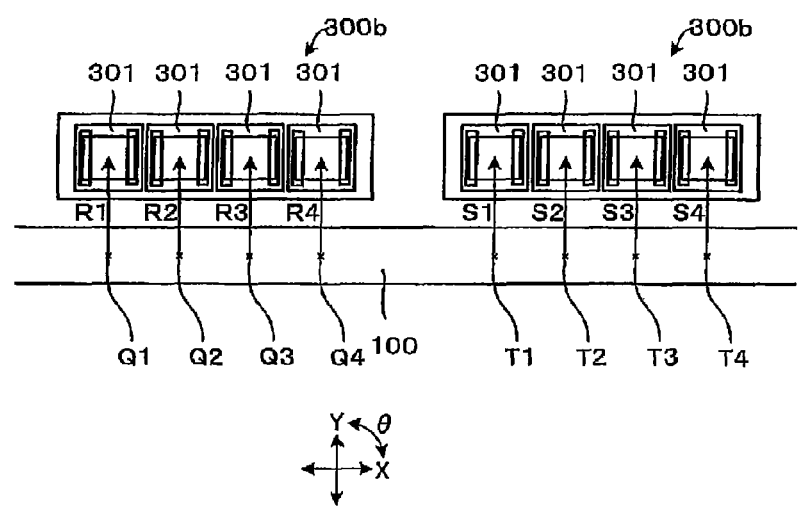
FIG. 8B is a plan view showing load ports installed alongside a track as a storage device and showing the positional relationships of the load ports along the track.

Next, a teaching process is executed with respect to a second load port 301 (steps S5 and S6). FIG. 8B shows an example in which two storage devices 300b are installed adjacent to the track 100. Each of the storage devices 300b is installed to have a prescribed positional relationship with respect to the track 100. More specifically, the storage devices 300b are positioned somewhat precisely to have prescribed positional relationships with respect to the positions Q1 and T1 along the track 100.

In step S5, one transport device 200 is driven, and teaching is executed with respect to a second load port 301 that serves as a standard. That is, the transport device 200 is driven so as to lower a container F onto one second load port 301 that serves as a standard and place the container F on a marker 301a provided on the second load port 301. A second load port 301 for which an installation precision has been confirmed is selected as the second load port 301 that serves as the standard.

For example, the leftmost second load port 301 of the storage device 300b on the left shown in FIG. 8B is selected as the standard. In such a case, one transport vehicle 200 is first arranged at the position Q1 on the track 100 adjacent to the standard second load port 301. The horizontal position adjusting mechanism 213 is then guided to adjust a position of the hoist mechanism 220 in a horizontal direction and the gripper mechanism 215 is lowered so as to place a container F onto the second load port 301. In this way, the teaching information representing a horizontal movement along the arrow R1 from the position Q1 to a position on the second load port 301 is acquired in terms of the directions X, Y, and θ.

Next, the information acquired with the teaching process of step S5 is copied as the teaching information for all other transport vehicles 200 in relation to the other second load ports 301 (S6). More specifically, the teaching information related to the horizontal movement R1 acquired in step S5 is set as teaching information related to the horizontal movements R2, R3, and R4 from the positions Q2 to Q4 to the second load ports 301 shown in FIG. 8B. Additionally, the teaching information related to the horizontal movement R1 is set as teaching information related to the horizontal movements S1 to S4 from the positions T1 to T4 to the second load ports 301 shown in FIG. 8B. For all other transport vehicles 200, too, the teaching information related to the horizontal movement R1 acquired in step S5 is set as the teaching information related to all other second load ports 301.

Thus, in the case of the second load ports 301, a result obtained by executing teaching of one transport vehicle 200 at one second load port 301 can be used as teaching information for the other transport vehicles 200 in relation to the one second load port 301 and the other second load ports 301. The reason this can be done is that it is not necessary to position a container F on a storage device 300b as precisely as on a manufacturing device 99. The second load ports 301 do not have positioning protrusions and the process of placing a container F onto a second load port 301 does not require any positioning as precise as the positioning executed when placing a container F onto a first load port 98. Another reason is that, so long as the same types of storage devices 300b are installed so as to have the same positional relationship with respect to the track 100 and the storage devices can be installed with a certain degree of precision, teaching information related to one of the second load ports 301 can be copied as teaching information related to all the other second load ports 301.

In the previously explained first and second preferred embodiments, the second load ports 301 do not require precise positioning and thus do not require the same teaching process as the first load ports 98. Consider, for example, an example in which 1000 second load ports 301 are installed and the same precise teaching process as used with the first load ports 98 is to be similarly executed with respect to the second load ports 301. If the time required to execute the teaching process with respect to one first load port 98 is 10 minutes, for example, then the total time required to execute the teaching process with respect to 1000 second load ports 301 is 10,000 minutes, i.e., approximately 167 hours, per single transport vehicle 200.

However, with the previously explained preferred embodiments, there is no risk of the undersurface of a container F hitting a positioning protrusion because the second load ports 301 are not provided with positioning protrusions. Consequently, it is not a problem if the position of a container F is somewhat offset from a prescribed placement position. In short, it is not necessary to position the container F with respect to a second load port 301 as precisely as the positioning to a first load port 98. Therefore, after teaching has been executed for one transport vehicle 200, it is acceptable to copy the resulting teaching information to be used with the other transport vehicles 200. Furthermore, the teaching process used with respect to one second load port 301 requires much less time than the teaching process used with respect to a first load port 98. As a result, the time required for teaching can be greatly shortened in comparison with a case in which all of the load ports include positioning protrusions.

Other Preferred Embodiments

The present invention is not limited to the preferred embodiments explained heretofore. Various changes can be made without departing from the scope of the present invention. In particular, the preferred embodiments and variations presented heretofore can be combined freely as necessary.

For example, the marker 301a preferably provided on a second load port 301 in the previously explained preferred embodiments may be provided on all of the second load ports 301. Reasons for doing so are explained in (a) and (b) below.

(a) If it is discovered that a second load port 301 has been inadvertently shifted out of position after the installation of the transport system 1 has been completed, the placement position of a container F can be confirmed using the marker when the second load port 301 is returned to its original position.

(b) When a worker has lifted a container F off a second load port 301 during maintenance or the like, the marker can be used to return the container F to its original position on the second load port 301.

It is also acceptable to provide markers 301a only on second load ports 301 that required a marker, and it is acceptable not to provide a marker on any of the second load ports 301. The same options as explained above apply to the through holes 401a in the case of the load ports 401.

Although in the previously explained preferred embodiments, storage devices 300a to 300c are preferably installed near a ceiling, it is acceptable for a temporary placement platform to be installed on a floor for storing containers F. In such a case, second load ports 301 are fixed to an upper surface of the temporary placement platform. It is also acceptable if the second load ports 301 are fastened to the temporary placement platform using a fastening tool 312 as in the second preferred embodiment, such that an upper surface of the second load ports 301 is tilted so as to be parallel to an undersurface of a container F.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transport system, comprising:
   a first load port and a second load port each including a loading surface arranged to allow an article to be loaded onto the loading surface from above the loading surface, the article including a positioning hole located in an undersurface of the article; and
   a transport device arranged to lower the article to the first load port and the second load port; wherein
   a positioning protrusion corresponding to the positioning hole is provided on the loading surface of the first load port;
   the transport device is arranged to align the positioning hole with the positioning protrusion when lowering the article to the first load port;
   the transport device is a transport vehicle travelling along a track that passes above the first load port;
   the second load port is arranged at a side of the track;
   the transport vehicle includes a hoist mechanism configured to suspend a gripping mechanism, and a horizontal position adjusting mechanism configured to adjust a horizontal position of the hoist mechanism;
   the transport device is configured to tilt the undersurface of the article with respect to a horizontal direction before placing the article onto the second load port; and
   the loading surface of the second load port is tilted with respect to the horizontal direction such that an angle between the loading surface of the second load port and the undersurface of the article before the article is placed onto the second load port is smaller than an angle between the undersurface and the horizontal direction.

2. The transport system recited in claim 1, wherein the undersurface of the article includes a first surface and a second surface that is arranged higher than the first surface, a slip prevention member provided on the loading surface of the second load port has a thickness such that when the article is placed on the second load port, the second surface contacts an upper surface of the slip prevention member and the first surface is separated from the loading surface of the second load port.

3. The transport system recited in claim 2, wherein the gripping section is configured to grip the article, and the hoist mechanism includes a moving section arranged to move the gripping section in a vertical direction while supporting the gripping section in a suspended state.

4. The transport system recited in claim 3, wherein the horizontal position adjusting mechanism includes a moving arm arranged to move the gripping section in a horizontal direction while supporting the gripping section in a suspended state.

5. The transport system recited in claim 2, further comprising a processing device arranged to execute a manufacturing process on the article and a storage device arranged to store the article are further provided, wherein the first load port is a port provided on the processing device and the second load port is a port provided on the storage device.

6. The transport system recited in claim 1, wherein the gripping section is configured to grip the article, and the hoist mechanism includes a moving section arranged to move the gripping section in a vertical direction while supporting the gripping section in a suspended state.

7. The transport system recited in claim 6, wherein the horizontal position adjusting mechanism includes a moving arm arranged to move the gripping section in a horizontal direction while supporting the gripping section in a suspended state.

8. The transport system recited in claim 1, further comprising a processing device arranged to execute a manufacturing process on the article and a storage device arranged to store the article, wherein the first load port is a port provided on the processing device and the second load port is a port provided on the storage device.

9. A transport system, comprising:
   a processing device;
   a storage device arranged to store an article including a positioning hole located in an undersurface of the article;
   a first load port that is provided on the processing device and includes a loading surface arranged to allow the article to be loaded onto the loading surface from above the loading surface;
   a second load port that is provided on the storage device and includes a loading surface arranged to allow the article to be loaded onto the loading surface from above the loading surface;
   a track arranged above the first load port and at a side of the second load port; and a transport vehicle arranged to travel along the track while holding the article in a suspended state and to lower the suspended article onto the first load port and the second load port; wherein a positioning protrusion corresponding to the positioning hole is provided on the loading surface of the first load port;

the transport vehicle is arranged to align the positioning hole with the positioning protrusion in relation to a horizontal direction when lowering the article to the first load port;

the transport vehicle includes a hoist mechanism configured to suspend a gripping mechanism, and a horizontal position adjusting mechanism configured to adjust a horizontal position of the hoist mechanism;

the transport device is configured to tilt the undersurface of the article with respect to a horizontal direction before placing the article onto the second load port; and the loading surface of the second load port is tilted with respect to the horizontal direction such that an angle between the loading surface of the second load port and the undersurface of the article before the article is placed onto the second load port is smaller than an angle between the undersurface and the horizontal direction.

10. The transport system recited in claim 9, further comprising a slip prevention member, wherein the undersurface of the article includes a first surface and a second surface that is arranged higher than the first surface, and the slip prevention member has a thickness such that when the article is placed on the second load port, the second surface contacts an upper surface of the slip prevention member and the first surface is separated from the loading surface of the second load port.

11. A set-up method for a transport system provided with a plurality of first load ports and a plurality of second load ports, the method comprising:

providing the transport system of claim 1;

lowering the article to each of the first load ports while adjusting a position of the article in the horizontal direction;

lowering the article to one of the second load ports while adjusting a position of the article in the horizontal direction; and acquiring information used to control a positioning of the article with respect to each of the second load ports based on a result of the lowering of the article to the one of the second load ports.

* * * * *